United States Patent [19]
Bergman

[11] Patent Number: 5,493,538
[45] Date of Patent: Feb. 20, 1996

[54] MINIMUM PULSE WIDTH ADDRESS TRANSITION DETECTION CIRCUIT

[75] Inventor: David W. Bergman, Bedford, Tex.

[73] Assignee: Texas Instruments Incorporated, Dallas, Tex.

[21] Appl. No.: 339,427

[22] Filed: Nov. 14, 1994

[51] Int. Cl.[6] .................................................. G11C 7/00
[52] U.S. Cl. ................. 365/233.5; 365/194; 365/189.08; 327/26
[58] Field of Search ................................ 365/233.5, 194, 365/189.08; 327/182, 183, 184, 261, 26, 34

[56] References Cited

U.S. PATENT DOCUMENTS

| | | | |
|---|---|---|---|
| 4,843,596 | 6/1984 | Miyatake et al. | 365/233.5 |
| 4,922,122 | 5/1990 | Dubujet | 365/233.5 |
| 5,088,858 | 4/1991 | Ikeda | 365/233.5 |
| 5,124,584 | 6/1992 | McClure | 365/233.5 |
| 5,313,436 | 5/1994 | Matsubishi | 365/233.5 |
| 5,357,480 | 10/1994 | Vinal | 365/233.5 |

*Primary Examiner*—Tan T. Nguyen
*Attorney, Agent, or Firm*—W. Daniel Swayze, Jr.; W. James Brady, III; Richard L. Donaldson

[57] ABSTRACT

A latch circuit is set by a detection circuit which detects a difference between inputs. One of the inputs being delayed by a predetermined period of time. The output of the latch circuit is inverted and delayed through a delay circuit and resets the latch circuit.

14 Claims, 4 Drawing Sheets

MINIMUM PULSE WIDTH ADDRESS TRANSITION DETECTION CIRCUIT

TECHNICAL FIELD OF THE INVENTION

This invention relates to digital circuits and more particularly to address translation detection (ATD) circuits.

BACKGROUND OF THE INVENTION

Address transition detection ATD circuits are employed in memory devices to detect a change in the user-supply address bits, forming an address transition to access a new location in memory. As the address transition is detected by the memory device, a new address has been supplied by the user, and this address must be decoded by the decoding circuitry of the memory device in order to access the actual memory address. When a memory address is to be accessed, the data path to and from the memory address must be precharged in preparation for the transfer of this data. This precharging may involve precharging a capacitor of a row and column to be addressed. Typically, a pulse from the ATD circuit is used in the memory to begin precharging this path.

FIG. 1 illustrates ATD circuit 100. The ATD circuit 100 includes a delay circuit 102 and an exclusive OR, XOR, 104. The circuit 104 produces a high output or logical "1" whenever the inputs to the XOR circuit 104 are different. The XOR circuit 104 produces a low output or logical zero output whenever the inputs to the XOR circuit are the same.

FIG. 2 illustrates that the input is normally unchanging high logical 1 or low/logical 0 while no address transition is requested. If the address transition is requested, the input changes. The output from circuit 104 is low while both the input and the output of circuit 102 changes from high to low or low to high. When the input is not equal, the output of circuit 102, and the output to circuit 104 is high. The output from circuit 104, is illustrated in FIG. 2. Initially, the output of circuit 104 is low while both the input and output from delay circuit 102 is high. When input is low due to an address transition, the output of delay circuit 102 remains high. The output of circuit 104 is high in response to the unequal input to circuit 104. Afar a predetermined period of time, the output of circuit 102 goes low. In response, the output of circuit 104 goes low. In addition, FIG. 2 illustrates a second address transaction. However, as illustrated in FIG. 2, the width of the output pulse of circuit 104 is dependent upon the time delay generated by circuit 102.

As illustrated in FIG. 3, a narrow input pulse results in a narrow output pulse from circuit 104. This narrow width pulse from the output of circuit 104 is insufficient to precharge the path.

SUMMARY OF THE INVENTION

The present invention provides a circuit that will detect a narrow pulse being inputted to the circuit and provides, in response to the narrow pulse, a pulse output from the circuit of sufficient width to adequately precharge the data path, for example a memory device. A latch circuit is set in response to the input and produces an output pulse. The output pulse is inverted and subsequently delayed by a delay circuit. The output of the delay circuit is used to reset the latch circuit to terminate the output pulse of the latch circuit.

The present invention includes an address transition detection circuit to detect a change in address for a memory circuit to form an address transition signal including an input circuit to input an address transition signal indicative of the change in the address, a first delay circuit to delay the address transition signal to form a delayed signal, a detection circuit to detect a difference between the address transition signal and the delayed signal by forming a difference signal for a sufficient time such that a path to the memory circuit may be precharged and a latch circuit to latch the difference signal for a sufficient time such that a path to the memory circuit may be precharged.

The present invention further includes a second delay circuit to delay on output signal of the latch circuit. The latch circuit further includes an inverter circuit to invert the output signal. The latch circuit may be a set-reset circuit. The detection circuit may be a XNOR circuit. The latch circuit may be a first NAND circuit and a second NAND circuit. The detection circuit includes a pull up circuit and a pull down circuit.

The present invention further includes an address transition detection circuit to detect a change in address for a memory circuit including an input circuit to input an address transition signal indicative of the change in the address, a first delay circuit to delay the address transition signal to form a delayed signal, a detection circuit to compare the address transition signal and a delayed signal and to form a difference signal in response to a difference between the address transition signal and the delayed signal, the detection circuit including; a pull up circuit to form said address transition signal and a pull down circuit to terminate the address transition signal, a latch circuit to latch the address transition signal for a sufficient length of time so a path to the memory circuit can be precharged. The latch circuit may include a switch to control the pull up circuit and the pull down circuit so that the address transition signal is not terminated for said sufficient length of time so the path to the memory circuit can be precharged. The switch may disconnect the pull down circuit for the sufficient length of time. The switch may connect the pull up circuit for the sufficient length of time. The latch circuit further includes a NAND circuit to control the switch. The latch circuit includes a second delay circuit connected to the NAND circuit. The NAND circuit may be connected to the pull up circuit and the pull down circuit.

DETAILED DESCRIPTION OF THE INVENTION

Figure 1:
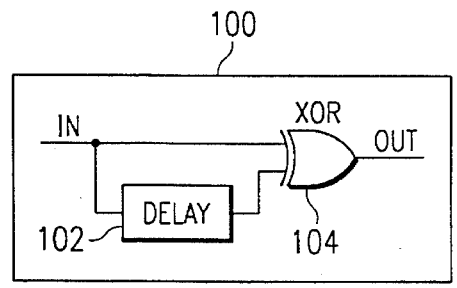
FIG. 1 is an address detection transition detection circuit.
Figure 2:
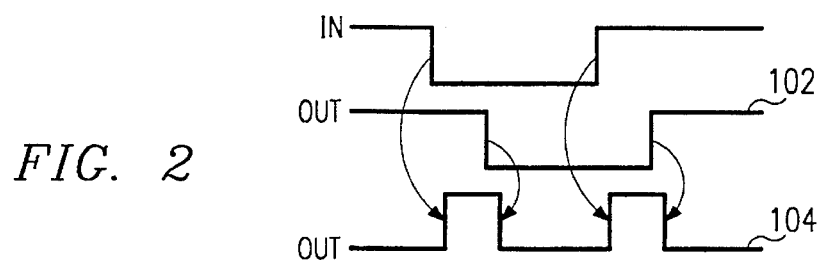
FIGS. 2 and 3 illustrates input and output waveforms from the address transition detection circuit of FIG. 1.
Figure 3:
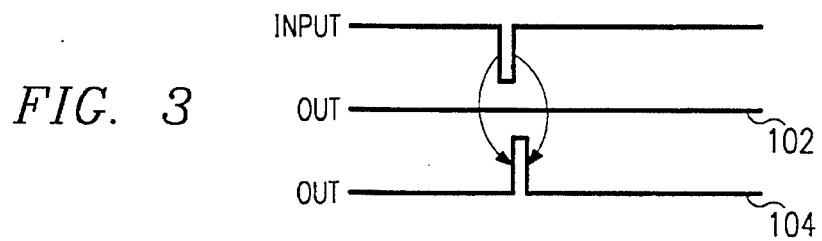
Figure 4:
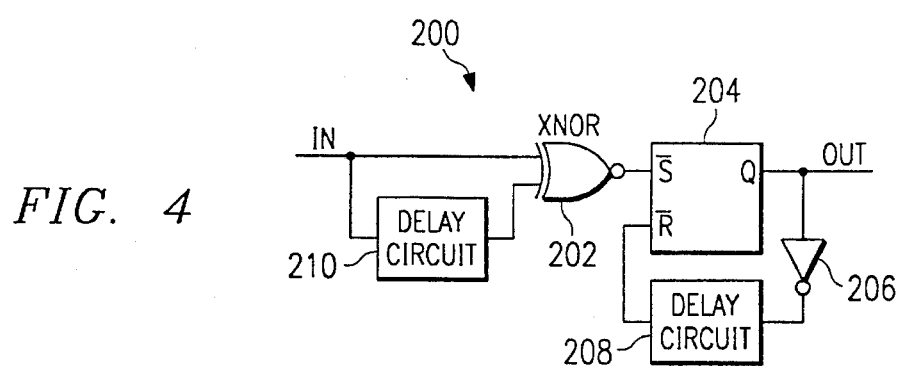
FIG. 4 illustrates an address transition detection circuit of the present invention.

As illustrated in FIG. 4, a signal IN indicative of an address in the memory is input to XNOR 202. Additionally, the signal IN indicative an address is input to delay circuit 210. This signed IN may be a low/logical 0 signal or a high/logical 1 signal. The delay circuit 210 delays the signal for a predetermined period of time. A delayed signal corresponding in shape to the signal indicative of the address, but delayed for a predetermined period of time, is output from the delay circuit 210. The delay circuit 210 is connected to the detection circuit, for example a XNOR circuit 202. This XNOR circuit 202 is connected to the latch circuit 204, for example to the inverse set input, which will set the latch circuit 204 when the s̄ input signal to the latch 204 circuit is low or logical 0, while the output to of the latch circuit is output to inverter 206. The inverter 206 is connected to delay circuit 208, which is coupled to the latch circuit 204, for example at the inverse reset input terminal r̄.

In operation, as a signal IN indicative of an address, for example a transition to low or logical 0 to indicate one change of address, is input both to the XNOR circuit 202 and the delay circuit 210. The output from delay circuit 210 is the same shape as the signal indicative the address, but delayed in time. The detection circuit or XNOR circuit 202 outputs a low or logical 0 whenever the inputs to the XNOR circuit 202 are different and a high or logical 1 whenever the inputs to the XNOR circuit 202 are the same. As the signal IN is input to the XNOR circuit 202, the output of the XNOR circuit 202 is low or logical 0 since the inputs to the XNOR circuit 202 are different, for example the output of delay circuit remains high for the predetermined period of time. The output of the XNOR circuit 202 remains low until the delay circuit 210 outputs the delayed signal to the XNOR circuit, after the predetermined period of time, which causes the output of the XNOR circuit to be high or logical 1. As the output of the detection or XNOR circuit 202 is low, the output of latch circuit 204 is high or logical 1. The inverter circuit 206 inverts the logical high to a low or logical 0 signal. The delay circuit 208 may be a falling edge only delay circuit which delays the falling edge of the input yet does not delay the rising edge; thus, the output of delay 208 is to a low or logical zero state after a further, second predetermined period of time from the falling edge of inverter circuit 206. The low or logical 0 signal from delay circuit 208 resets the latch circuit 204.

The predetermined period of time delay generated by circuit 208 may be longer or equal than the predetermined period of time delay generated by circuit 210 so that the output of the detection circuit or XNOR circuit 202 will go high before the output of delay circuit 208 goes low. Under this circumstance, the time delay of circuit 208 determines the width of the pulse which appears on the output of circuit 204.

Figure 12:
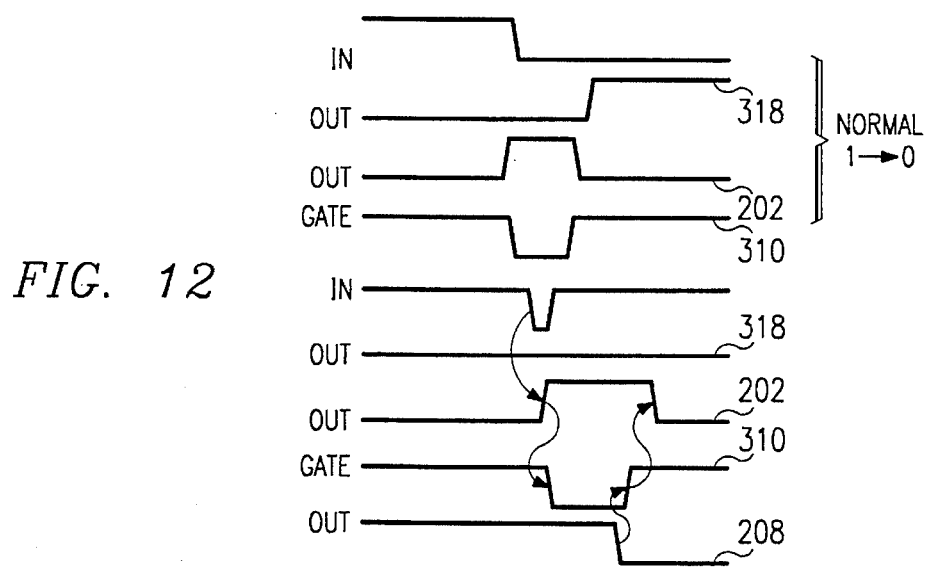
FIG. 12 illustrates the waveforms of the circuit of FIG. 11.

If the input is just a short pulse, for example a spike as illustrated in FIG. 12, signal IN is different than the output of circuit 210, due to the time delay generated by circuit 210. Thus, the inputs to circuit 203 are different which causes the output of circuit 205 to go high. When the output of circuit 205 goes high, the output from NAND circuit 212 goes low, because the output from delay stage 208 remains high until a delay after the output of circuit 202 has gone high. When the output of NAND circuit 212 is low, the transistor 310 turns off, and the p type transistor 305 turns on, which keeps the output of circuit 200 high. The output of circuit 200 remains high until the output of delay stage 208 goes high, which turns off transistors 310 and 305, which brings the output of circuit 200 low again. Thus, even for a narrow input spike, this circuit 200 produces an output pulse with a width defined by the delay of delay state 208. This pulse width will allow sufficient time to precharge a data path which will come from the new memory location which has been accessed by the change of address.

Figure 5A:
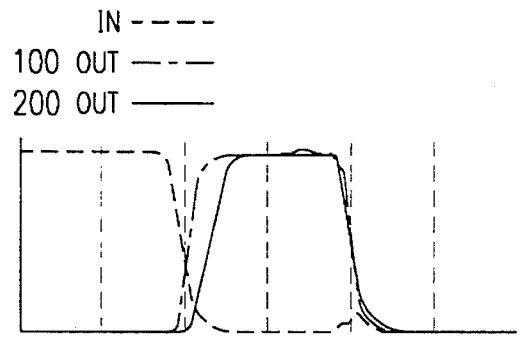
FIGS. 5a and 5b illustrate waveforms of FIG. 4.
Figure 5B:
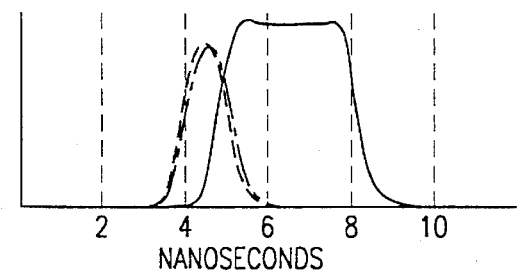

FIG. 5 illustrates the output of the ATD circuit 100 as compared with the output of ATD circuit 200. As illustrated in 5a, for a input signal IN, which is relatively short, the outputs of both circuits 100 and 200 are approximately the same. However, as illustrated in 5b, if the input signal is of relatively short duration, the output of ATD circuit 100 is approximately the same width or time duration as the input and as a consequence does not provide sufficient time in order to precharge the path. In contrast, the ATD circuit 200 for the same input circuit provides an output pulse which is approximately 2.5 nanoseconds in duration which is sufficient to recharge the path.

Figure 6:
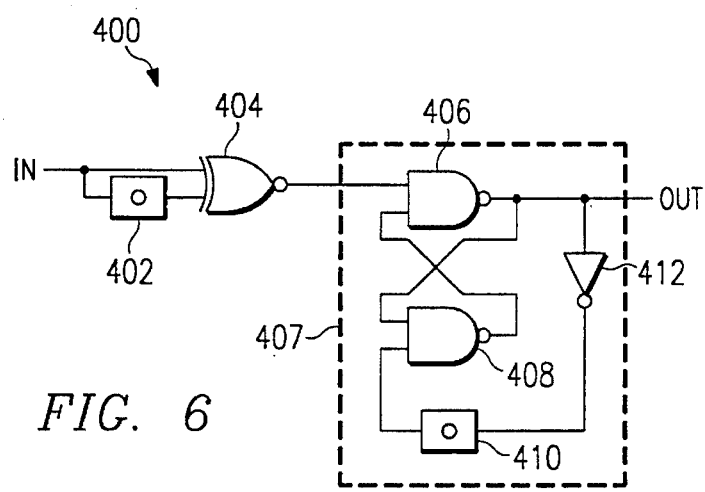
FIG. 6 illustrates an address transition detection circuit of the present invention.
Figure 7:
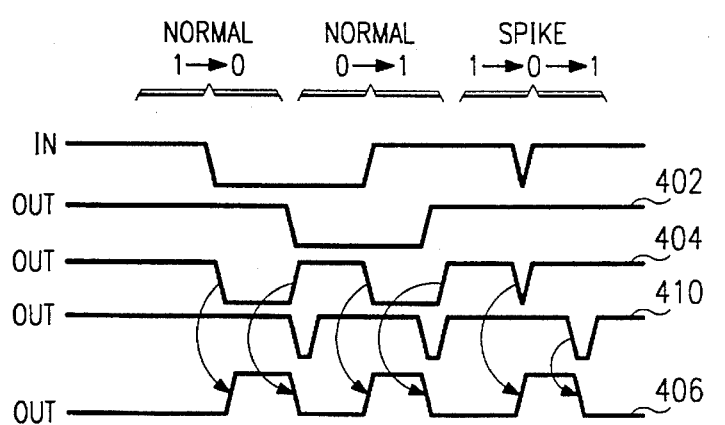
FIG. 7 illustrates the waveforms of FIG. 6.

FIG. 6 illustrates another ATD circuit 400. The delay circuit 402 is connected to the detection circuit 404. The detection circuit 404 is coupled to the latch circuit 407, for example to the NAND circuit 406. Additionally, the NAND circuit 408 is coupled to the NAN]) circuit 406. The NAND circuit 406 is connected to the delay circuit 412, which is connected to the delay circuit 410. The delay circuit 410 is connected to the NAND circuit 408. Additionally, the NAND circuit 408 is coupled to the NAND circuit 406.

The operation of the ATD circuit 400 is similar to the operation of the ATD circuit 200 as illustrated in FIG. 4. One difference is the two NAND circuits 406 and 408, forming latch circuit 407, perform similar functions to the latch circuit 204. The output of NAND circuit 406, for example the falling edge of the output occurs on the later of the output of XNOR circuit 404, for example rising edge or the falling edge of the output of delay circuit 410. Furthermore, the rising edge of the output of NAND 406 occurs on the falling edge of the output of the XNOR circuit 404. Thus, when the signal IN transitions, the output of the XNOR circuit falls to low or logical zero resulting in the output of NAND 406 going high since the output of NAND circuits are high or logical 1, unless the inputs to the NAND circuit are both high or logical 1. Thus, if either the output of NAND 408 or XNOR circuit 404 is 0, the output of NAND 406 is 1.

In operation, as the signal IN indicative of an address for example a low signal is input to the XNOR circuit 404, the output of the XNOR circuit 404 is logically low. Since initially, both the inputs to the XNOR are the same, for example low, the output of XNOR 404 is logical 1. Initially as a signal transition indicative of an address is received input to the XNOR circuit 404, the output of the XNOR circuit 404 goes low or logical 0. This output of the NAND 406 goes from a low to high or logical 1, the inverter circuit 412 inverts the high signal to output a low signal. The delay circuit 410 delays the falling edge, of the low signal, but eventually goes to a logical low after the predetermined time. The output of NAND circuit 408 is initially high before the address change as a result of output of circuit 410 being high and the output of NAND circuit 406 being high, but is high as the output of circuit 410 is low and output circuit 406 is high as the output of circuit 410 is low and the output of circuit 404 is high, resulting in the output of NAND 406 going to a low or logical zero state. Thus, the output of 406 remains high until the later of the output of XNOR 404 going low or the output of delay 410 going low.

Figure 8:
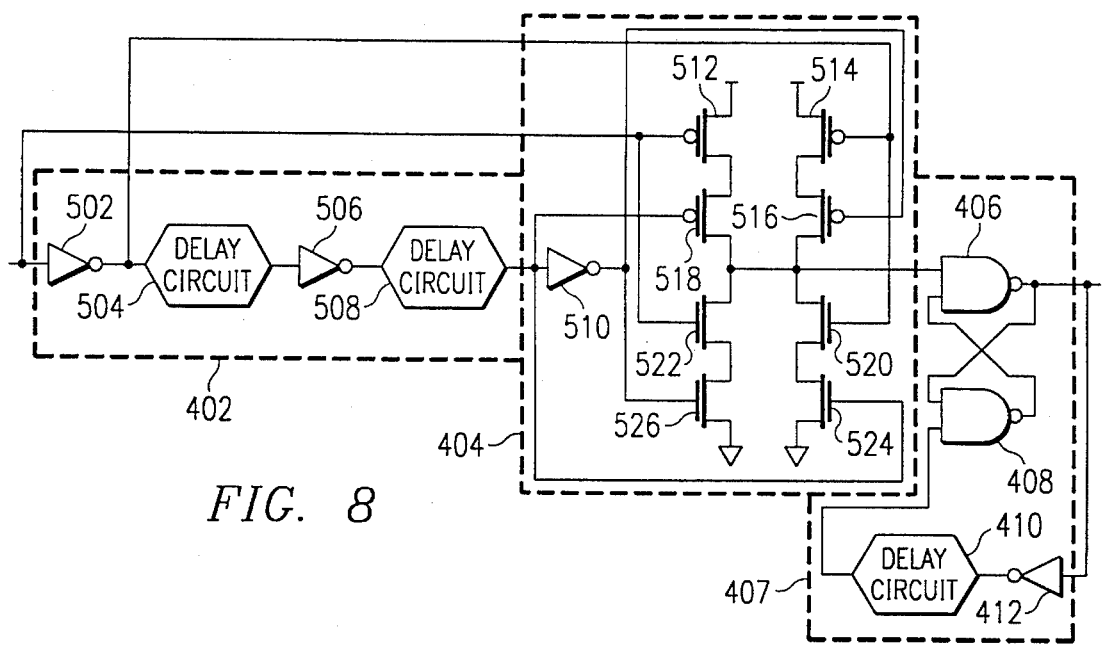
FIG. 8 illustrates one embodiment of the address transition detection circuit of FIG. 6.

FIG. 8 illustrates that the delay circuit 402 includes an inverter circuit 502, a first delay circuit 502, a second inverter circuit 506 and a second delay circuit 508. As the signal IN indicative of an address is applied to the first inverter circuit 502, this signal is inverted by the first inverter 502 to provide an inverted signal to first delay circuit 504. The inverter circuit 506 inverts the delayed signal, and the second delay circuit further delays the delayed and inverted signal from inverter circuit 506.

FIG. 8 illustrates that first inverter circuit 502 is connected to the first delay circuit 504, which is connected to the second inverter circuit 506. The second inverter circuit 506 is connected to the second delay circuit 508. The second delay circuit 508 is connected to the inverter circuit 510 which is connected both to the gate of n-type transistor 526 and to the gate of p-type transistor 516. First inverter circuit 502 is connected to the gate of p-type transistor 514 and to the gate of n-type transistor 520. The gate of p-type transistor 512 and n-type transistor 522 is connected to the input to receive the signal IN indicative of an address. The source of transistor 512 is connected to $V_{dd}$ while the drain of transistor 512 is connected to the source of transistor 518. The drain of transistor 518 is connected to NAND circuit 406. Additionally, the source of transistor 514 is connected to $V_{dd}$ while the drain of transistor 514 is connected to the source of transistor 516 while the drain of transistor 5 16 is connected to NAND gate 406. The drain of transistor 522 is connected to NAND circuit 406 while the source of transistor 522 is connected to the drain of transistor 526. The source of transistor 526 is connected to ground potential. The drain of transistor 520 is connected to NAND circuit 406 while the source of transistor 520 is connected to the drain of circuit 524. The source of transistor 524 is connected to ground.

Transistors 512 and transistor 518 form a pull up circuit, and transistors 514 and transistor 516 form another pull up circuit. Transistor 522 and transistor 526 form a pull down circuit while transistor 520 and transistor 524 form another pull down circuit. The pull up circuits when activated through the respective gates pull the input to the NAND circuit 406 up to a high or logical 1 state while the pull down circuits through the respective gates pull down or reduce the input to NAND circuit 406 to ground potential or logical zero.

The pull up circuit formed by transistors 512 and 518 pull up the input to the NAND circuit 406 while both the input to the first inverter circuit 502 and the output of the second delay circuit 508 are low or at a logical zero. Since this condition places both transistors 512 and 518 in a conductive state so that the input to the NAND circuit 406 is essentially $V_{dd}$. Under these conditions, transistor 522 is non-conductive as well transistor 514 and transistor 524. The result is the corresponding circuits are not operating as either pull up or pull down.

The other pull up circuit including transistors 514 and 516 pull up the input to the NAND gate 406 when both the output of inverter 502 is low and the output of inverter circuit 510 is low. Both pull down circuits are non-conducting since transistor 526 is non-conductive as well as transistor 520. The pull up circuit including transistor 512 and 518 is non-conductive since both transistors 512 and 518 are non-conductive.

The pull down circuit including transistors 522 and transistor 526 pulls down the NAND circuit 406 to a logical low or logical zero state when both transistors 522 and 526 are conductive. Both transistor 522 and 526 are conductive when the input, for example signal IN to first inverter circuit 502 is high or logical 1 and when the output of inverter circuit 510 is high or logical 1. The other pull down circuit including transistors 520 and 524 are non-conductive since the output of first inverter circuit 502 is low and the output of second delay circuit 508 is low. Both pull up circuits are non-conductive since the input to first inverter circuit 502 is high, turning off transistor 512 and the output of inverter 510 is high, turning off transistor 516. Lastly, the pull down circuit including transistor 520 and 524 pull down the input to NAND circuit 406 while the output of first inverter circuit 502 is high and the output of second delay circuit 508 is high.

Figure 9:
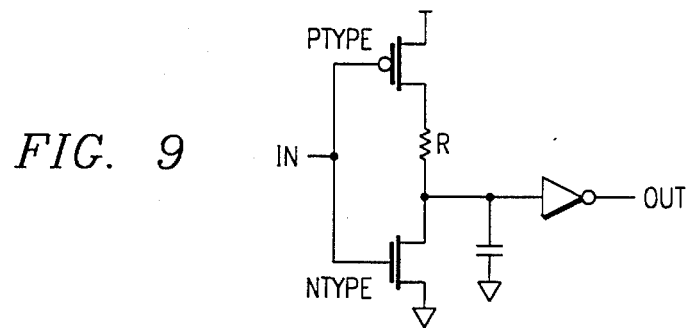
FIG. 9 illustrates a delay circuit.

FIG. 9 illustrates a falling edge only delay circuit of the present invention. Only the falling edge of the input signal is delayed while the rising edge essentially remains undelayed. While the input signal is high, the p-type transistor is non-conductive while the n-type transistor is conductive. The capacitor is low while the output of the inverter is high. When the input voltage switches to low, the p-type transistor is conductive while the n-type transistor is non-conductive. Current flowing through the resistor to the capacitor forms a RC circuit; the voltage of the capacitor rises. At the threshold voltage of the invertor the inventor switches to low. When the input signal is high, the circuit returns to the initial state.

Figure 10:
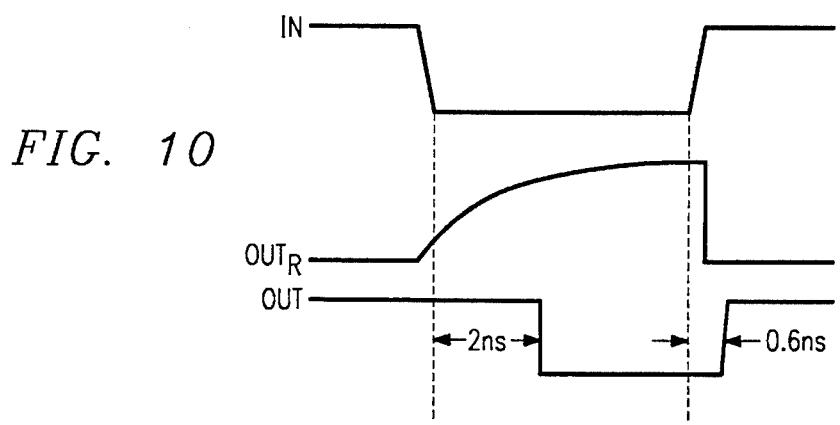
FIG. 10 illustrates waveforms of the delay circuit.

FIG. 10 illustrates the waveforms assorted with the falling edge only delay circuit.

FIG. 10 illustrates the input signal IN, the output of the resistor and transistor which is applied to the capacitor and the output voltage of the circuit.

Figure 11:
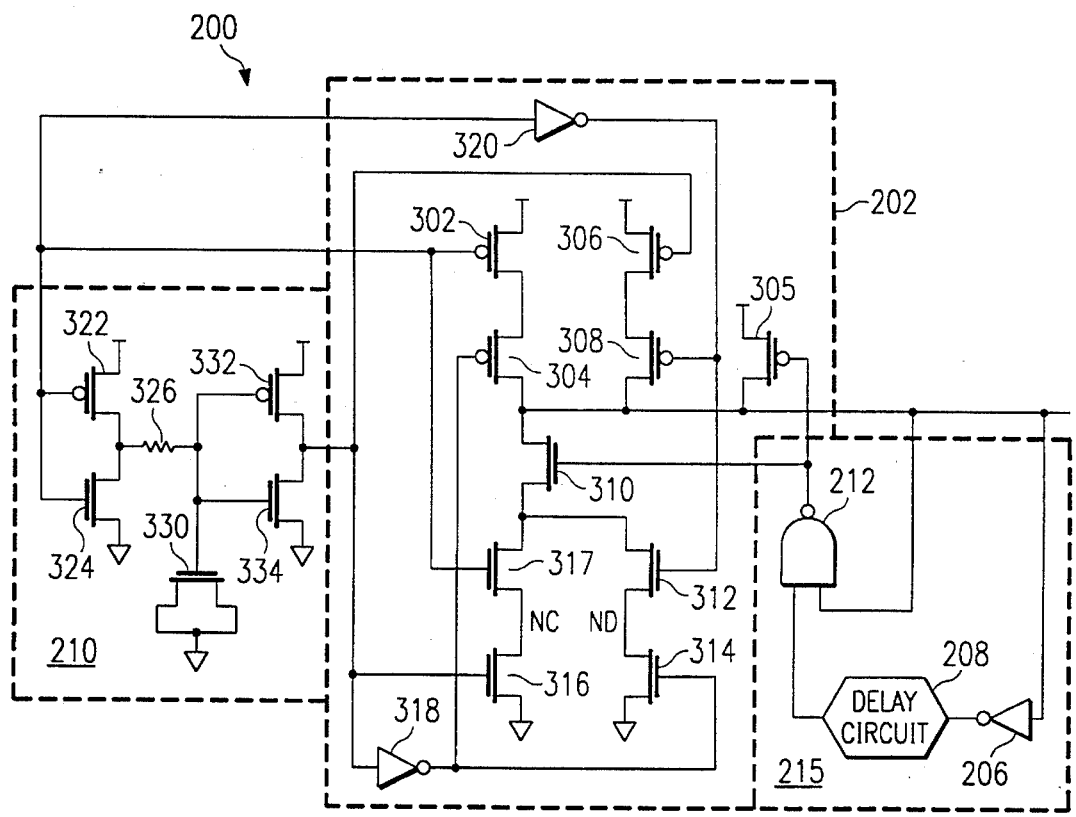
FIG. 11 illustrates another address transition detection circuit of the present invention.

FIG. 11 illustrates another ATD circuit. The delay circuit 210 includes a p-type transistor 322 and n-type transistor 324. The gate of transistor 322 is connected to the input while the source of transistor 322 is connected to $V_{dd}$. The drain of transistor 322 is connected to the drain of transistor 324. The gate of transistor 324 is connected to the input while the source of transistor 324 is connected to ground. Both the drain of transistor 322 and the drain of transistor 324 is connected to a resistor 326. The resistor 326 is connected to the capacitor 330, the gate of p-type transistor 332 and the gate of n-type transistor 334. The source of transistor 332 is connected to $V_{dd}$ while the drain of transistor 332 is connected to the drain of transistor 334. The source of transistor 334 is connected to ground. Both the drain of transistor 332 and the drain of transistor 334 is connected to the input of inverter 318, the gate of p-type transistor 306 and the gate transistor 316.

In operation, if the input is high, the transistor 324 provides a connection to ground for resistor 326; however, if the input is low, transistor 322 raises the voltage at resistor 326 to by connecting resistor 326 to $V_{dd}$; however, the capacitor 330 is initially uncharged while the input is high keeping the voltage of gate of transistor 332 and 334 low which in turn maintains transistor 332 on, keeping the input to the inverter 318 high, essentially at $V_{dd}$. However, as the voltage on capacitor 330 rises to the threshold voltage of transistor 334, transistor 332 is turned off and transistor 334 is turned on switching the voltage at the input of inverter circuit 318 from a high or logical 1 to a low or logical zero. The detection circuit 202 includes two pull up circuits and two pull down circuits. The one pull up circuit includes p-type transistor 302 and p-type transistor 304, the gate of transistor 302 is connected to the input while the gate of transistor 304 is connected to the output of inverter 318. The other pull up circuit includes p-type transistor 306 and p-type transistor 308. The gate of transistor 308 is connected to the output of inverter 320, which is connected to the input. The gate of transistor 306 is coupled to the output of the delay circuit 210. The source of transistor 302 is coupled to $V_{dd}$ and the drain of transistor 302 is coupled to the source of transistor 304. The drain of transistor 304 is coupled to the drain of n-type transistor 310. The source of transistor 306 is coupled to $V_{dd}$, while the drain of transistor 306 is connected to the source of transistor 308. The drain of transistor 308 is connected to the drain of transistor 310. Additionally, the detection circuit 203 includes two pull down circuits. One pull down circuit includes n-type transistors 317 and 316. The gate of n-type transistor 317 is coupled to the input while the gate of transistor 316 is connected to the output of the delay circuit 210. The drain of transistor 317 is coupled to the source of transistor 310 while the drain of n-type transistor 316 is coupled to the source of transistor 317. The source of transistor 316 is coupled to ground. The other pull down circuit includes n-type transistors 312 and n-type transistors 314. The gate of transistor 312 is connected to the output of inverter 320 while the gate of transistor 314 is coupled to the output of inverter circuit 318. The drain of transistor 312 is coupled to the source of transistor 310 while the drain of transistor 314 is connected to the source of transistor 312. The source of transistor 314 is coupled to ground. The transistor 310 controls both the pull down circuits such that these circuits only pull down the output of the detection circuit 203 while the output of the NAND circuit 212 is high or logical 1. The transistor 310 switches the pull down circuit so that the pull down circuit does not pull down the output to low or logical 0. The p-type transistor 322 operates such that the output of latch circuit 202 is held high whenever the pull up circuits are inactivated and the output of the NAND circuit 212 is low. The p-type transistor 305 pulls the output by the high or logical 1. Both transistor 310 and 305 are controlled by the NAND circuit 212 of the latch circuit 215, which include NAND circuit 212 inverter circuit 206 and delay circuit 208.

FIG. 12 illustrates the waveforms of the various outputs of detection circuit 203. FIG. 12 illustrates that when the input goes low, the output of inverter 318 goes high after a predetermined period of time from when the input has gone low. This is indicative of the delay that the delay circuit 210 has delayed the input. The output of circuit 202 is high when the input goes low as a result of the pull up circuits including the transistors 306 and 308. Since the input is high, the output of inverter 320 is low, resulting in transistor 306 conducting. The output of the delay circuit 210 is low since the predetermined period of time has not elapsed, resulting in transistor 308 conducting. This pulls up the output to $V_{dd}$ or logical 1. After the predetermined period of time, the output of delay circuit 210 is low. The output of inverter circuit 318 is high. This activates the pull down circuit including transistors 312 and 314. The gate of transistor 310 goes low as the output of 202 goes high as a result of the NAND circuit 212.

OTHER EMBODIMENTS

Although the present invention and its advantages have been described in detail, it should be understood that various changes, substitutions and alterations can be made herein without departing from the spirit and scope of the invention as defined by the appended claims.

What is claimed is:

1. An address transition detection circuit to detect a change in address for a memory circuit to form an address transition signal comprising:

an input circuit to input an address transition signal indication of said change in said address;

a first delay circuit to delay said address transition signal to form a delayed signal;

a detection circuit to detect a difference between said address transition signal and said delayed signal by forming a difference signal for a sufficient time such that a path to said memory circuit may be precharged; and a latch circuit to latch said difference signal for a sufficient time so that a path to said memory circuit may be precharged.

2. An address transition detection circuit as in claim 1, wherein said latch circuit includes a second delay circuit to delay an output signal of said latch circuit.

3. An address transition detection circuit as in claim 2, wherein said latch circuit includes an inverter circuit to invert said output signal.

4. An address transition detection circuit as in claim 1, wherein said latch circuit is a set-reset circuit.

5. An address transition detection circuit as in claim 1, wherein said detection circuit is a XNOR circuit.

6. An address transition detection circuit as in claim 1, wherein said latch circuit is a first NAND circuit and a second NAND circuit.

7. An address transition detection circuit as in claim 1, wherein said detection includes a pull up circuit and a pull down circuit.

8. An address transition detection circuit to detect a change in address for a memory circuit, comprising:

an input circuit to input an address transition signal indicative of said change in said address;

a first delay circuit to delay said address transition signal to form a delayed signal;

a detection circuit to compare said address transition signal and said delayed signal to form a difference signal in response to a difference between address transition signal and said delayed signal, said circuit including a pull up circuit to form said address transition signal and a pull down circuit to terminate said address transition signal;

a latch circuit to latch said address transition signal for a sufficient length of time so a path to said memory circuit can be precharged.

9. An address transition detection circuit as in claim 8, wherein said latch circuit includes a switch to control said pull up circuit and said pull down circuit so that said address transition signal is not terminated for said sufficient length of time so said path to said memory circuit can be precharged.

10. An address transition detection circuit as in claim 9, wherein said switch disconnects said pull down circuit for said sufficient length of time.

11. An address transition detection circuit as in claim 9, wherein said switch connects said pull up circuit for said sufficient length of time.

12. An address transition detection circuit as in claim 8, wherein said latch circuit further includes a NAND circuit to control said switch.

13. An address transition detection circuit as in claim 12, wherein said latch circuit includes a second delay circuit connected to said NAND circuit.

14. An address transition detection circuit as in claim 12, wherein said NAND circuit is connected to said pull up circuit and said pull down circuit.

* * * * *